United States Patent [19]

Ohkura et al.

[11] Patent Number: 5,691,237
[45] Date of Patent: Nov. 25, 1997

[54] METHOD FOR FABRICATING SEMICONDUCTOR DEVICE

[75] Inventors: Yoshiyuki Ohkura; Hideki Harada; Tadasi Oshima, all of Kawasaki, Japan

[73] Assignee: Fujitsu Limited, Kawasaki, Japan

[21] Appl. No.: 455,521

[22] Filed: May 31, 1995

Related U.S. Application Data

[62] Division of Ser. No. 278,953, Jul. 22, 1994, Pat. No. 5,448,111.

[30] Foreign Application Priority Data

Sep. 20, 1993 [JP] Japan .................. 05-233947

[51] Int. Cl.⁶ ............................. H01L 21/3105
[52] U.S. Cl. .................. 437/195; 437/238; 437/228; 148/DIG. 25
[58] Field of Search ............. 437/238, 228, 437/67, 984, 195; 148/DIG. 118, DIG. 25; 427/97

[56] References Cited

U.S. PATENT DOCUMENTS

| | | | |
|---|---|---|---|
| 3,598,761 | 8/1971 | Woulbroun et al. | 257/794 |
| 3,660,156 | 5/1972 | Schmidt . | |
| 4,133,690 | 1/1979 | Muller . | |
| 4,222,792 | 9/1980 | Lever et al. | 257/644 |
| 4,514,580 | 4/1985 | Bartlett | 257/794 |
| 4,732,761 | 3/1988 | Machida et al. | 437/238 |
| 4,804,254 | 2/1989 | Doll et al. | 350/344 |
| 5,078,801 | 1/1992 | Malik . | |
| 5,160,998 | 11/1992 | Itoh et al. | 257/633 |
| 5,258,334 | 11/1993 | Lantz, II . | |
| 5,264,395 | 11/1993 | Bindal et al. . | |
| 5,354,697 | 10/1994 | Oostra et al. . | |
| 5,387,480 | 2/1995 | Haluska et al. . | |
| 5,434,451 | 7/1995 | Dalal et al. . | |
| 5,436,083 | 7/1995 | Haluska et al. . | |
| 5,436,084 | 7/1995 | Haluska et al. . | |
| 5,468,685 | 11/1995 | Orisaka et al. . | |

FOREIGN PATENT DOCUMENTS

| | | |
|---|---|---|
| 0071205 | 2/1983 | European Pat. Off. . |
| 0 519 393 | 3/1993 | European Pat. Off. . |
| 54-140884 | 1/1979 | Japan . |
| 55-12735 | 4/1980 | Japan . |
| 55-117242 | 9/1980 | Japan . |
| 56-104443 | 8/1981 | Japan . |
| 60-107233 | 6/1985 | Japan . |
| 61-8941 | 1/1986 | Japan . |
| 62-221137 | 9/1987 | Japan . |
| 4-236435 | 8/1992 | Japan . |

OTHER PUBLICATIONS

Patent Abstracts of Japan (EPO) No. JP5347284, Dec. 27, 1993—vol. 18, No. 188 "Surface Flattening Method of Polymer Blend Film".

Patent Abstracts of Japan (EPO) No. JP6097298, Apr. 8, 1994—vol. 18, No. 359 "Forming Method of Semiconductor Device Insulating Film".

Patent Abstracts of Japan (EPO) No. JP61212056, Sep. 20, 1986—vol. 11, No. 46 "Solid State Image Pickup Device".

Patent Abstracts of Japan (EPO) No. JP5175194, Jul. 13, 1993—vol. 17, No. 579 "Manufacture of Semiconductor Device".

*Primary Examiner*—George Fourson
*Attorney, Agent, or Firm*—Armstrong, Westerman, Hattori, McLeland & Naughton

[57] ABSTRACT

A semiconductor substrate 11 having concavities and convexities in the upper surface, and silica particles (granular insulators) 15 provided in the concavities to planarize the entire upper surface of the semiconductor substrate 11 are included. First, the silica particles 15 are laid over an upper surface of a semiconductor substrate 11 to provide the granular insulators 15 in cavities in the upper surface of the semiconductor substrate 11, and the silica particles 15 provided on convexities on the upper surface of the semiconductor substrate 11 are removed, whereby the concavities 11 are buried with the silica particles 15 so as to improve global planarization.

13 Claims, 15 Drawing Sheets

GLOBAL STEP : x-y

METHOD FOR FABRICATING SEMICONDUCTOR DEVICE

This application is a division of application Ser. No. 08/278,953 filed Jul. 22, 1994, now U.S. Pat. No. 5,448,111.

BACKGROUND OF THE INVENTION

The present invention relates to a semiconductor device including a semiconductor substrate with stepwise differences on the upper surface thereof, and a method for fabricating the semiconductor device.

Semiconductor devices of high integration, such as LSIs, VLSIs, etc., generally have the so-called multi-wiring layer structure having an n-th wiring layer formed by providing a wiring in a layer on a substrate, and further an n+1-th wiring layer formed through an insulating layer.

Insulating layers, or inter-layer insulating layers, included in such multi-wiring layer structure have the intrinsic purpose of securing insulation between upper and lower layers (between a substrate and a wiring layer or between wiring layers), and in addition the purpose of covering smoothly the rough substrate or wiring layers having stepwise differences on the upper surface thereof for planarization.

That is, as integration of semiconductor integrated circuits are improved, steps on surfaces of formed devices are large, and wires have to be thickened in compensation for lowered wiring capacities due to micronization of wiring. Taking it into consideration that steps resulting from a wiring tend to be larger, it is necessary to ensure planarization of inter-film insulating films in forming multi-layer wirings.

This is because, if an inter-layer insulating film adversely permits roughness of a lower layer (a substrate or a lower wiring layer) to be still present in an upper layer, there is a risk that breakage and defective insulation will be caused to a wiring of the upper layer, and a margin of a focal depth of a resist in the wiring will be adversely narrowed, and integration of the wiring may be impaired.

The conventional methods for forming an inter-layer insulating film includes a method (a) for forming an $SiO_2$ film on the surface of a substrate by CVD using a compound gas, such as $SiH_4$ or others, a method (b) for forming a CVD film using ozone-TEOS (tetraethoxy silane), a method (c) for forming an SOG (spin on glass) film by solving $SiO_x$ in a solvent, such as alcohol or others, and applying the $SiO_x$ to the surface of a substrate, and other methods.

But in the method (a), roughness of a wiring itself is still present in an upper layer. A problem with the method (a) is that a formed inter-layer insulating film has very poor planarization.

In the above-described methods (b) and (c), roughness in a region with small inter-wire paps can be planarized by reflow, but steps (global steps) between regions without wirings formed or plane electrode layers such as ground electrode or power electrode layers, and regions with fine wirings formed dense can not be eliminated. This is a problem with the methods (b) and (c).

SUMMARY OF THE INVENTION

A first object of the present invention is to provide a semiconductor device which is sufficiently planarized with steps eliminated not only in narrow regions between wires, but also in an entire region of the substrate.

A second object of the present invention is to provide a method for fabricating a semiconductor device which can eliminate steps not only in narrow regions between wires, but also in the entire region of the substrate to thereby planarize the device.

The above-described first object is achieved by a semiconductor device comprising a semiconductor substrate having convexities and concavities in an upper surface thereof; and granular insulators disposed in the concavities to planarize the upper surface of the semiconductor substrate.

In the above-described semiconductor device, it is preferable that the granular insulators are adhered to the semiconductor substrate through a spin on glass film.

In the above-described semiconductor device, it is preferable that the semiconductor device further comprises an insulating film covering the convexities and concavities in an upper surface of the semiconductor substrate, and the granular insulators is disposed on the insulating film in the concavities of the semiconductor substrate.

In the above-described semiconductor device, it is preferable that the device further comprises an insulating film covering the granular insulators.

In the above-described semiconductor device, it is preferable that the semiconductor device further comprises another insulating film covering the granular insulators.

In the above-described semiconductor device, it is preferable that the semiconductor device further comprises a spin on glass film covering the granular insulators.

In the above-described semiconductor device, it is preferable that the granular insulator has a particle size above 0.3 times of a step formed by the concavities and below 1.5 times of the same.

The above-described second object is achieved by a method for fabricating a semiconductor device comprising: a granular insulators laying step of laying granular insulators over an upper surface of a semiconductor substrate to provide the granular insulators in cavities in the upper surface of the semiconductor substrate; and a granular insulators removing step of removing the granular insulators provided on convexities on the upper surface of the semiconductor substrate.

In the above-described method for fabricating the semiconductor device, it is preferable that the method further comprises: an SOG film applying step of applying an SOG film onto the upper surface of the semiconductor substrate before the granular insulators laying step; and an SOG film heat treating step of heat treating the SOG film after the granular insulator laying step to adhere the granular insulators to the semiconductor substrate through the SOG film.

In the above-described method for fabricating the semiconductor device, it is preferable that the method further comprises: an SOG film applying step of applying the SOG film onto the granular insulators after the granular insulators laying step; and an SOG film heat treating step of heat treating the SOG film after the SOG film applying step to adhere the granular insulators to the semiconductor substrate through the SOG film.

In the above-described method for fabricating the semiconductor device, it is preferable that the method further comprises: a lift-off layer forming step of forming a lift-off layer on the semiconductor layer before the granular insulators laying step, the granular insulators removing step being for removing the lift-off layer to remove the granular insulators.

In the, above-described method for fabricating the semiconductor device, it is preferable that the lift-off layer is formed of a resist.

In the above-described method for fabricating the semiconductor device, it is preferable that the lift-off layer is formed of amorphous carbon.

In the above-described method for fabricating the semiconductor device, it is preferable that the granular insulators removing step is for scraping the upper surface of the semiconductor substrate to remove the granular insulator.

In the above-described method for fabricating the semiconductor device, it is preferable that the granular insulators removing step is for grinding the semiconductor substrate to remove the granular insulators.

In the above-described method for fabricating the semiconductor device, it is preferable that the method further comprises a silicon oxide film forming step of forming a silicon oxide film onto the upper surface of the semiconductor substrate before the granular insulators laying step; and a heat treating step of heat treating the granular insulators to adhere the granular insulators to the semiconductor substrate after the granular insulators laying step.

In the above-described method for fabricating the semiconductor device, it is preferable that the granular insulators removing step is for scraping the upper surface of the semiconductor substrate to remove the granular insulators on the convexities.

In the above-described method for fabricating the semiconductor device, it is preferable that the granular insulators removing step is for grinding the semiconductor substrate to remove the granular insulators on the convexities.

According to the present invention, granular insulators are provided in the concavities of a semiconductor substrate having the concavities and convexities on the upper surface, whereby steps not only in narrow regions between wires, but also in the entire region of the substrate can be eliminated, and higher degrees of global planarization can be obtained.

In the above-described semiconductor device, granular insulators are adhered to a semiconductor substrate through an SOG film, whereby the granular insulators in the concavities are not displaced.

In the above-described semiconductor device, the semiconductor device further comprises an insulating film covering the convexities and concavities in an upper surface of the semiconductor substrate, and the granular insulators is disposed on the insulating film in the concavities of the semiconductor substrate, whereby steps not only in narrow regions between wires, but also in the entire region of the substrate can be eliminated, and higher degrees of global planarization can be obtained.

In the above-described semiconductor device, an insulating film is formed on a semiconductor substrate to cover the granular insulators, whereby higher degrees of global planarization can be obtained.

In the above-described semiconductor device, the semiconductor device further comprises another insulating film covering the granular insulators, whereby higher degrees of global planarization can be obtained.

In the above-described semiconductor device, the semiconductor device further comprises a spin on glass film covering the granular insulators, whereby higher degrees of global planarization can be obtained.

In the above-described semiconductor device, a particle diameter of the granular insulator is above 0.3 times and below 1.5 times of the steps or stepwise differences formed by concavities, whereby global steps can be sufficiently planarized.

According to the present invention, first, granular insulators are laid over an entire upper surface of a semiconductor substrate to provide the granular insulators in cavities on the upper surface of the semiconductor substrate, and the granular insulators provided on convexities on the upper surface of the semiconductor substrate are removed, whereby the concavities are buried with the granular insulators so as to improve global planarizarion.

In the above-described method for fabricating a semiconductor device, an SOG film is applied to a semiconductor substrate before the granular insulators laying step, and the SOG film is heat treated after the granular insulators laying step, whereby the granular insulators are adhered to the semiconductor substrate through the SOG film, and displacement of the granular insulators in the concavities can be prohibited.

In the above-described method for fabricating a semiconductor device, an SOG film is applied onto the granular insulators after the granular insulators laying step, and the SOG film is heat treated after the SOG film applying step, whereby the granular insulators are adhered to the semiconductor substrate through the SOG film.

In the above-described method for fabricating a semiconductor device, an lift-off layer is formed on a semiconductor substrate before the granular insulators laying step, and lifting off the lift-off layer, whereby the granular insulators on the convexities can be easily removed.

In the above-described method for fabricating a semiconductor device, the lift-off layer is formed of a resist, whereby the granular insulators on the convexities can be easily removed by lifting off without additional step.

In the above-described method for fabricating a semiconductor device, the lift-off layer is formed of amorphous carbon, whereby corrosion of aluminium wires due to residues based on hydrogen chloride used in the etching, which occurs when a resist is left on for a long period of time can be prevented.

In the above-described method for fabricating a semiconductor device, the upper surface of a semiconductor substrate is scraped off, whereby the granular insulators on the convexities can be easily removed.

In the above-described method for fabricating a semiconductor device, a semiconductor substrate is abraded, whereby the granular insulators on the convexities can be easily removed.

In the above-described method for fabricating the semiconductor device, a silicon oxide film is formed onto the upper surface of the semiconductor substrate before the granular insulators laying step, and the granular insulators are heat treated after the granular insulators laying step, whereby the granular insulators are adhered to the semiconductor substrate.

In the above-described method for fabricating the semiconductor device, the upper surface of the semiconductor substrate is scrapped off, whereby the granular insulators on the convexities can be easily removed.

In the above-described method for fabricating the semiconductor device, the upper surface of the semiconductor substrate is grounded, whereby the granular insulators on the convexities can be easily removed.

DETAILED DESCRIPTION OF THE INVENTION

A semiconductor device and a method for fabricating the semiconductor device according to a first embodiment of the present invention will be explained with reference to FIGS. 1 to 3.

Figure 1:
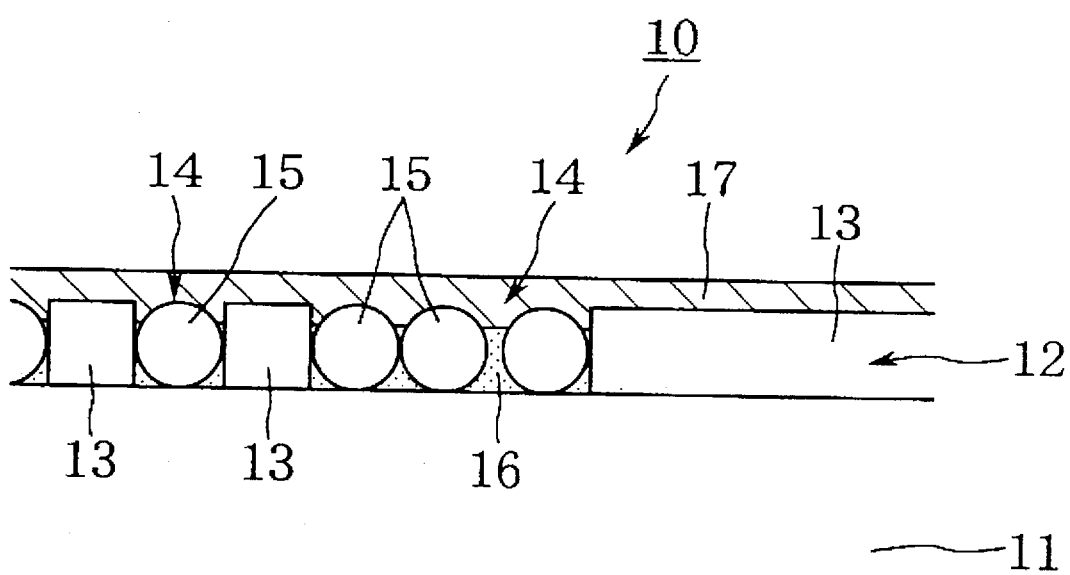
FIG. 1 is a sectional view of the semiconductor device according to a first embodiment of the present invention.

As shown in FIG. 1, the semiconductor device according to this embodiment includes a silicon wafer (semiconductor substrate) 11 on which devices are fabricated and an insulating layer such as $SiO_2$ are formed on the surface except the bonding or electrode portion, a wiring layer (convexity) 12 formed on the silicon wafer 11, and silica particles 15 (granular insulators) disposed in concavities 14 between each aluminium wire 13 and its adjacent one in the wiring layer 12.

This semiconductor device has the so-called multi-layer wiring structure having a plurality of wiring layers 12 (one of them shown) on the silicon wafer 11.

The aluminium wires 13 are formed in a 1 μm wiring thickness and a 1 μm minimum wiring width, and at a 1 μm minimum inter-wire interval or space. Concavities 14 are formed between each aluminium wire 13 and its adjacent one 13. The concavities 14 have a depth of steps between the upper surface of the aluminium wires 13 and the surface of the silicon wafer 11.

The silica particles 15 have a 0.8 μm diameter which is a little shorter than a wiring thickness (corresponding to the step between the aluminium wires 13 and the silicon wafer 11) of the aluminium wires 13 and are buried in the concavities 14 without any gap or space, i.e., in the gaps between each aluminium wires 13 and its adjacent one 13. The silica particles 15 are adhered to the silicon wafer 11 through an SOG film 16.

In a multi-layer wiring structure having two or more wiring layers, silica particles are adhered, through an SOG film, to an inter-layer insulating film formed on a wiring layer positioned below (a lower wiring layer).

The silica particles 15 can planarize the wiring layer 12 even when the wiring layer 12 as the next lower layer is rough.

A silicon oxide film ($SiO_2$ film) 17 is formed on the silica particles 15 and the aluminium wires 13 over the entire silicon wafer 11.

Thus, by forming an inter-layer insulating film of the silica particles 15 and the silicon oxide film 17, the semiconductor device 10 of the multi-layer wiring structure can eliminate the so-called global steps to thereby sufficiently planarize not only the regions between the wires but also the entire surface of the wiring layer 12, which is to be a next lower layer.

Then the method for fabricating the semiconductor device will be explained with reference to FIGS. 2 and 3.

FIGS. 2 and 3 are views explanatory of the method for fabricating a semiconductor device.

Figure 2A:
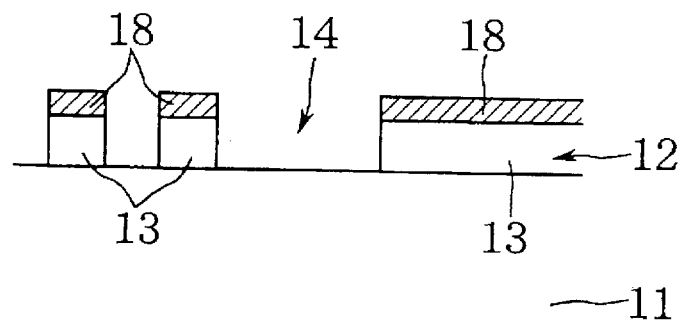
FIGS. 2A to 2C are views of the steps of the method for fabricating the semiconductor device according to the first embodiment of the present invention.

First, aluminium (Al) is sputtered on the silicon wafer 11 in a about 1 μm-thickness. Then a resist 18 is applied to the entire surface of the aluminium layer 13, and the resist 18 is patterned in a pattern required wiring patterns such as fine pattern of 1 μm line and space, and wide patterns or plane patterns. Using the patterned resist 18, the aluminium layer 13 is etched, and aluminium wires of a 1 μm wire thickness and a 1 μm minimum wire width, and at a 1 μm minimum inter-wire interval (FIG. 2A).

Thus the wiring layers with the aluminium wires 12 or 13 are formed on the silicon wafer 11.

Parts of the resist 18 on the aluminium wires 13 are left unremoved for use of the lift-off process which will be explained later.

Figure 2B:
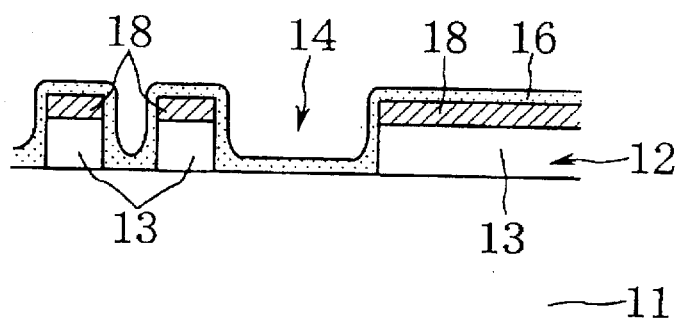

Subsequently inorganic SOG to be reflowed at about 200° C. is applied in an about 0.1 μm thickness by spin coating to the silicon wafer 11 with the aluminium wires 13 formed on, and the solvent is dried by means of a 150 ° C. hot plate. And an SOG film 16 is formed on the entire surface of the silicon wafer 11 including the aluminium wires 13 (FIG. 2B).

Further, after the SOG film 16 is formed, a solution of 0–8 μm-diameter silica particles 15 dispersed in an MIBK (methylisobutyl ketone) solvent is applied to the entire upper surface of the silicon wafer without any gap by spin coating.

Figure 2C:
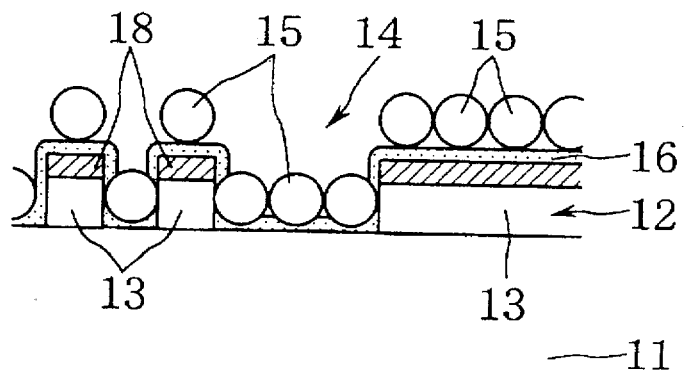

The application of this solution positions the silica particles 15 in the cavities 14 defined between each aluminium wire 13 and its adjacent one 13 on the silicon wafer 11, and on the aluminium wires 13 through the SOG film 16 (FIG. 2C).

Figure 3A:
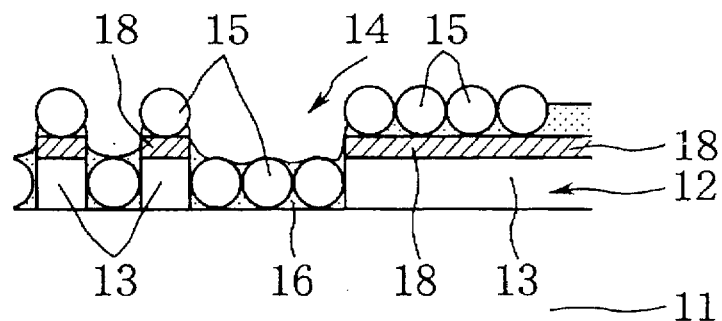
FIGS. 3A to 3C are views of the steps of the method for fabricating the semiconductor device according to the first embodiment of the present invention.

Subsequently the silicon wafer 11 is heated at 250 ° C. to bake the SOG film 16, so that the silica particles 15 are adhered to the upper surface of the silicon wafer 11 through the reflowed SOG film 16 (FIG. 3A).

Figure 3B:
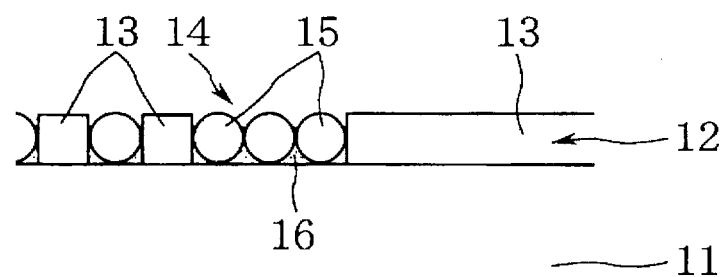

Then the resist 18 on the aluminum layer 13 on which the silica particles 15 is adhered is removed from the silicon wafer 11 with the silica particles adhered to. This removal of the resist 18 removes (lifts off) the silica particles 15 on the resist 18 together from the silicon wafer 11 together with the resist 18 (FIG. 3B).

Thus the silica particles 15 buried in the cavities 14 between the aluminium wires 13 eliminate or planarise the steps between the aluminium wires 13 and the silicon wafer 11.

Then the silicon wafer 11 after the lift-off process is rinsed with clean water.

Figure 3C:
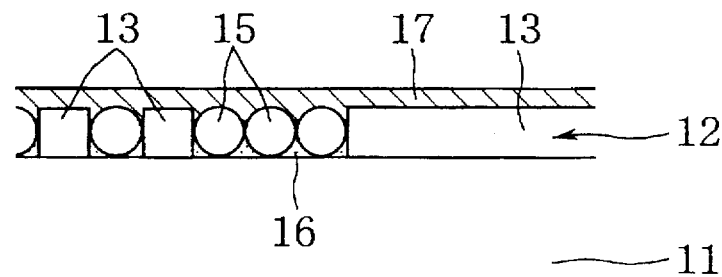

Then, the silicon oxide film 17 is formed on the entire upper surface of the silicon wafer 11 by CVD (FIG. 3C).

Thus according to this embodiment, the silica particles 15 are left between aluminium wires 13, and none of the silica particles 15 are left on the aluminium wires 13. The entire upper surface of the wiring layer 12 is planarized by an inter-layer insulating film of silica particles 15 and the silicon oxide film 17. The so-called global steps can be eliminated.

A semiconductor device and a method for fabricating the semiconductor device according to a second embodiment of the present invention will be explained with reference to FIGS. 4 and 5.

In the method for fabricating the semiconductor device according to a second embodiment, the SOG film 16 is not formed on the upper surface of the silicon wafer 11 before the silica particles 15 are laid, but is formed after the silica particles 15 are laid.

FIGS. 4 and 5 are views explanatory of the steps of the method for fabricating the semiconductor device 10.

Figure 4A:
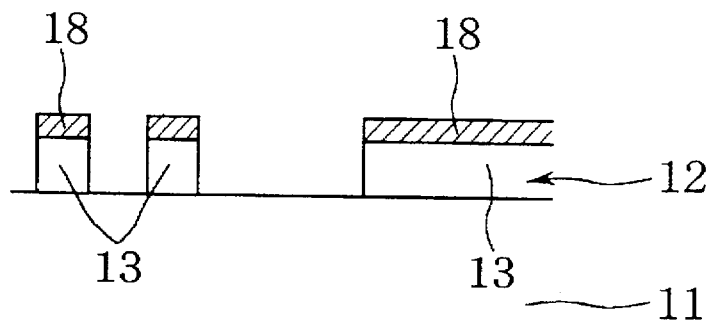
FIGS. 4A to 4C are views of the steps of the method for fabricating the semiconductor device according to a second embodiment of the present invention.

First aluminium (Al) is sputtered on the silicon wafer 11 in a about 1 μm-thickness. Then a resist 18 is applied to the entire surface of the aluminium layer 13 or substrate 11, and the resist 18 is patterned in a required wiring pattern. Using the patterned resist 18, the aluminium layer 13 is etched, and aluminium wires of a 1 μm wire thickness and a 1 μm minimum wire width, and at a 1 μm minimum inter-wire interval (FIG. 4A).

Thus a wiring layer 12 with the aluminium wires 13 is formed on the silicon wafer 11.

In this etching, parts of the resist 18 on the aluminium wires 13 are left unremoved for using lift-off process which will be explained later.

The, after the wiring layer 12 is formed, a solution of 0.8 μm-diameter silica particles 15 dispersed in an MIBK (methylisobutyl ketone) solvent is applied to the entire upper surface of the silicon wafer without any gap or space by spin coating.

Figure 4B:
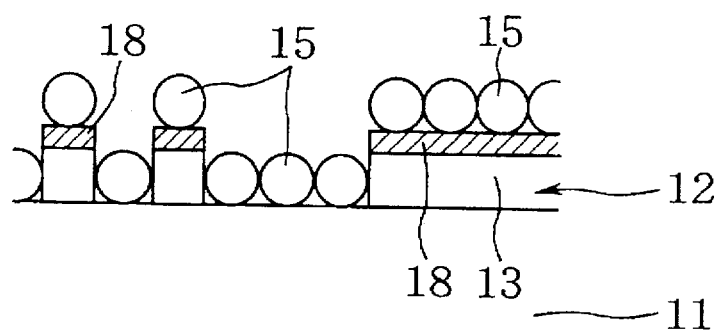

The application of the solution positions the silica particles 15 in cavities 14 defined between the aluminium wires 13 on the silicon wafer 11 and the aluminium wires 13, and on the aluminium wires 13 without any gap (FIG. 4B).

Furthermore, inorganic SOG to be reflowed at about 200° C. is applied by spin coating in an about 0.1 μm thickness to the silicon wafer 11 with the silica particles 15 laid on, and then the solvent is dried by a hot plate at 150 ° C.

Figure 4C:
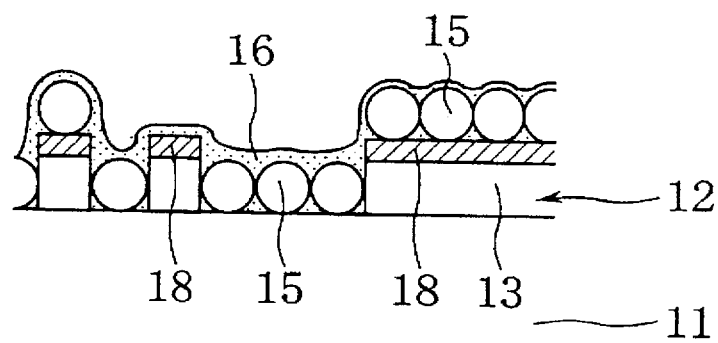

Thus an SOG film 16 burying the silica particles 15 is formed on the entire of the upper surface of the silicon wafer 11 including the aluminium 13 (FIG. 4C).

Then the silicon wafer 11 is heated at 250° C. to bake the SOG film 16, so that the silica particles 15 are adhered to the upper surface of the silicon wafer 11 through the reflowed SOG film 16.

Figure 5A:
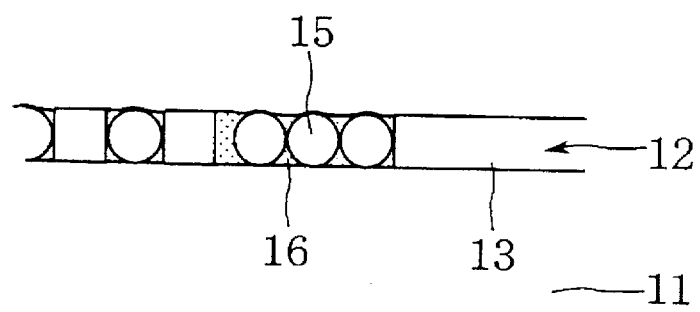
FIGS. 5A and 5B are views of the steps of the method for fabricating the semiconductor device according to the second embodiment of the present invention.

Then by an ashing apparatus (not shown) using $O_2$ plasmas, the resist 18 is removed from the silicon wafer 11 with the silica particles adhered to. This removal of the resist 18 removes the silica particles 15 on the resist 18 from the silicon wafer 11 together with the resist 18 (FIG. 5A).

And the silica particles 15 buried in the cavities 14 between each aluminium wire 13 and its adjacent one eliminate steps defined between the aluminium wires 13 and the silicon wafer 11.

Then the silicon wafer 11 after the removal of the silica particles is rinsed with pure water.

Figure 5B:
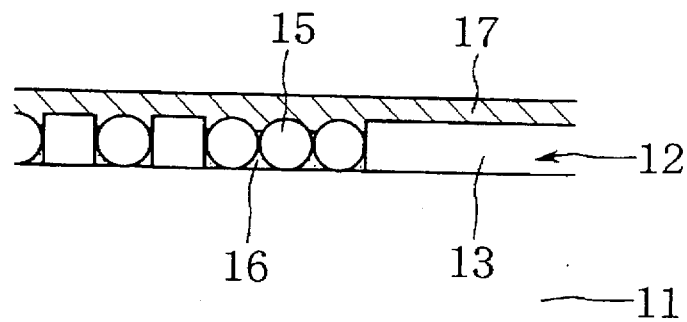

Subsequently a silicon oxide film 17 is formed on the entire surface of the silicon wafer 11 by CVD (FIG. 5B).

Thus according to this embodiment, the silica particles 15 are left between aluminium wires 13, and none of the silica particles 15 are left on the aluminium wires 13. The entire upper surface of the wiring layer 12 is planarized by an inter-layer insulating film of silica particles 15 and the silicon oxide film 17. The so-called global steps can be eliminated.

A semiconductor device and a method for fabricating the semiconductor device according to a third embodiment of the present invention will be explained with reference to FIGS. 6 and 7.

The method for fabricating the semiconductor device according to the third embodiment is characterized that the silica particles 15 on the aluminium wires 13 are mechanically removed. The method according to the third embodiment is the same as that according to the first embodiment in the other constitution and function.

FIG. 6 is views explanatory of the steps of the method for fabricating the semiconductor device 10.

The third embodiments quite the same as the method according to the first embodiment for fabricating the semiconductor device 10 up to the step of laying silica particles 15 on the entire upper surface of a silicon wafer 11 including aluminium wires 13, and adhering the silica particles 15 to the silicon wafer 11 through an SOG film 16 (FIGS. 2A to 2C, FIG. 3A).

Figure 6A:
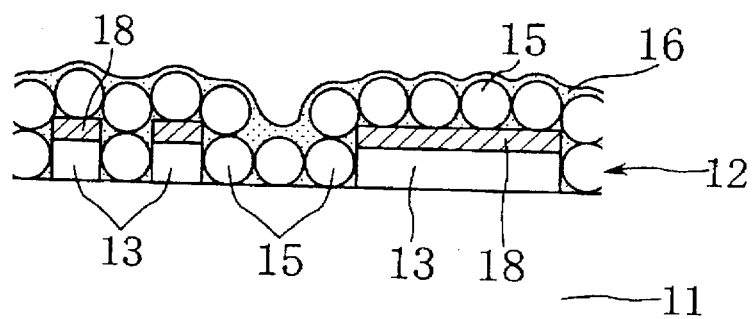
FIGS. 6A to 6D are views of the steps of the method for fabricating the semiconductor device according to a third embodiment of the present invention.
Figure 6B:
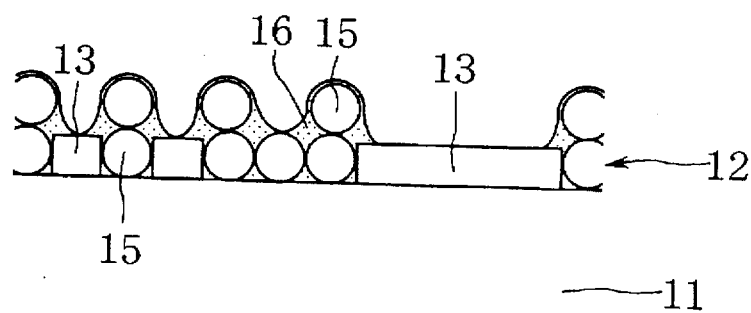

The silica particles 15 are laid in the cavities 14 in the silicon wafer 11 and on the aluminium wires 13 without any gap through the SOG film 16, and the silica particles 15 are adhered to the upper surface of the silicon wafer 11 (FIG. 6A).

Figure 6C:
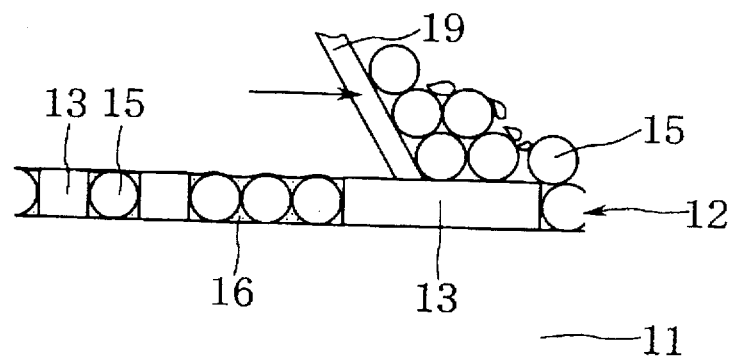

First, while a wet lift-off is conducted using an alkali solution which can solve the resist 18 (FIG. 6B), a squeegee (abrasion means) 19 for abrading off the silica particles 15 on move along the wiring layer 12 completely removes the silica particles 15 and the resist 18 on the aluminium wires 13 (FIG. 6C).

Figure 6D:
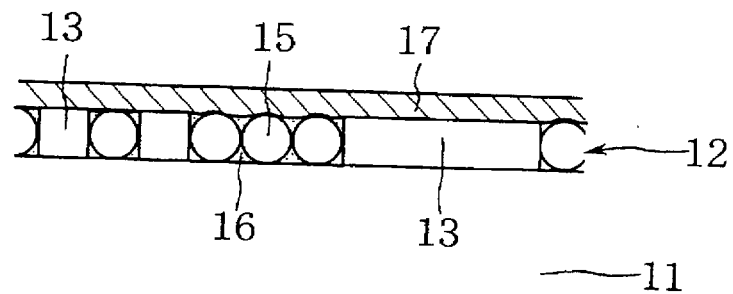

Then a silicon oxide film 17 is formed on the entire of the silicon wafer 11 by CVD (FIG. 6D).

As a variation of the third embodiment, abrasion means grinding or polishing means 20 which is moved on rotation over the wiring layer 12 to remove the silica particles 15 on the aluminium wires 13 may be used in place of the squeegee 19.

Figure 7:
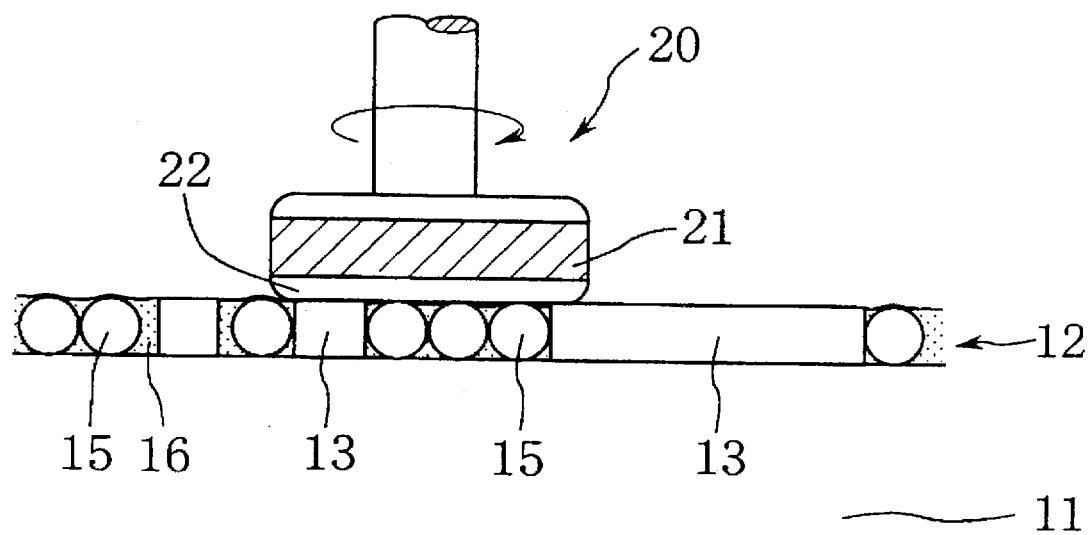
FIG. 7 is a view of a step of another example of the method for fabricating the semiconductor device according to the third embodiment of the present invention.

As shown in FIG. 7, the abrasion or grinding means 20 comprises a flexible body 21 having flexibility which allows the flexible body 21 to follow in required contact with the wiring layer 12 having the silica particles 15 to be removed, and an abrasive cloth 22 provided on the underside of the flexible body 21 in contact with the wiring layer 12, whereby the abrasion or grinding means 20 is moved on rotation over the wiring layer 12, so that the abrasive cloth 22 can remove the silica particles 15 laid upper of the upper surface of the aluminium wires 13.

The flexible body 21 is in the form of, e.g., a pole or columnar of a rubber-like material, or uses a coil spring or others so that flexibility is imparted to the underside thereof, and is flexible enough to contact the abrasive cloth 22 with the wiring layer 12. The abrasive cloth 22 is provided by an abrasive material, such as alumina ceramics, glass or others, which does not damage the wiring layer 12 during abrasion or polishing process.

In the above-described embodiments, the granular insulators are provided by silica particles 15, but are not limited to them. The granular insulators may be particulate bodies of an insulator, such as aluminium nitride, titanium oxide, boron nitride or others as long as they can form an inter-layer insulating film and are buried in the cavities 14 to successfully eliminate the steps between the aluminium wires 13 and the silicon wafer 11. It is preferred that a particulate body is selected in consideration of a dispersion ratio thereof in MIBK solvents, and dielectric constants.

It is preferred that a dielectric constant is below 4.5. The granular insulators are formed of a low-dielectric constant material, such as boron nitride, whereby a inter-layer capacitance of the aluminium wires 13 is lowered, whereby the semiconductor device can have higher speed.

A particle diameter of the granular insulator is not limited to 0.8 μm in the above-described embodiments. A particle diameter may be above 0.3 times and below 1.5 times of a step between the silicon wafer 11 and the aluminium wires 13 for first wiring layer. Such size can effectively eliminate steps of the aluminium wires 13.

Figure 8A:
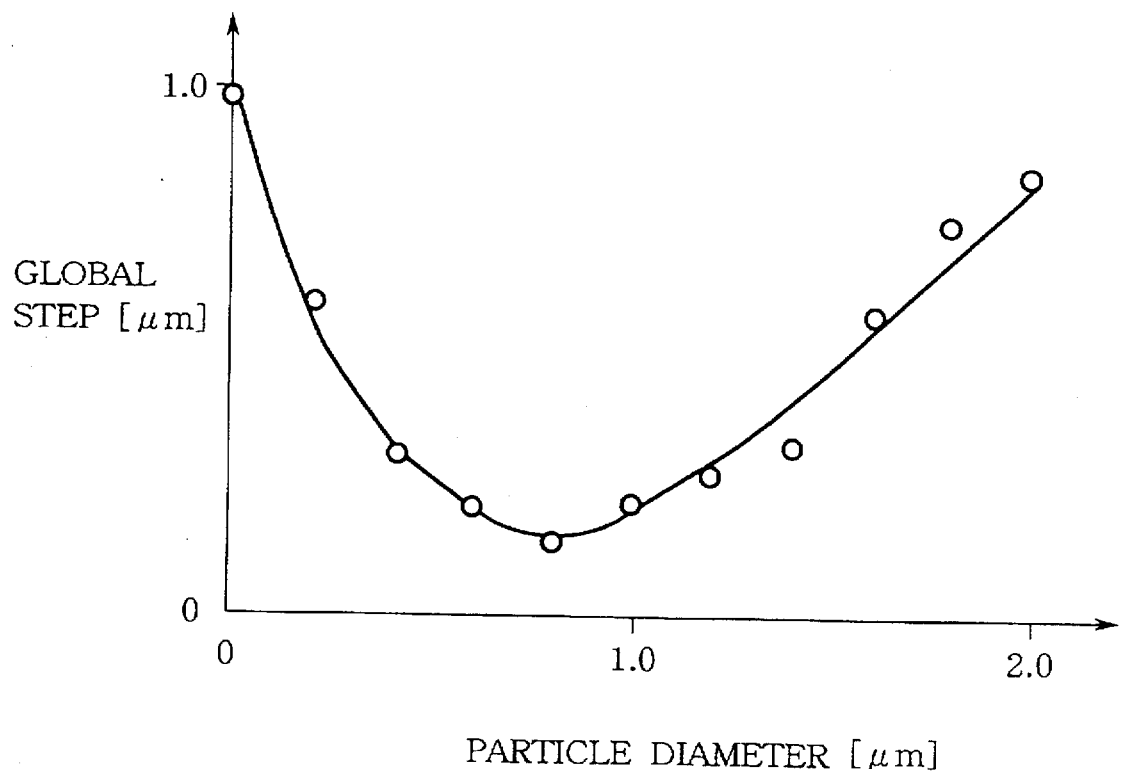
FIGS. 8A and 8B are views of relationships between particle diameters of silica particles and global steps.
Figure 8B:
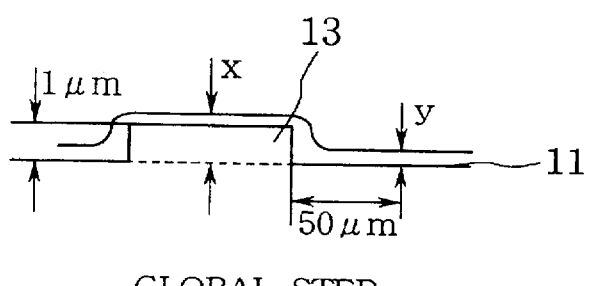

In connection with this, an optimization test was conducted on particle sizes of particulate bodies in the method according to the second embodiment for fabricating the semiconductor device. As seen in the result of the test of FIG. 8, it is found that a particulate body of a particle size which is above 0.3 times and below 1.5 times of a step (in this case 1 μm) can much further planarize a conventional global step (FIG. 8A). In this optimization test, the global step was given by subtracting a step y of a cavity spaced by 50 μm from the border of a 50 μm aluminium wire from a step x at the center of the aluminium wire (FIG. 8B). In the case that a particle diameter is 0.3 times of the step, about three layers of silica particles 15 are laid one on another in a cavity 14.

The concavities and convexities on the upper surface of the semiconductor substrate 11 are formed by the aluminium wires and, in addition, by the electrodes, oxide films, etc.

A method for fabricating a semiconductor device according to a fourth embodiment of the present invention will be explained with reference to FIGS. 9 and 10.

Figure 9A:
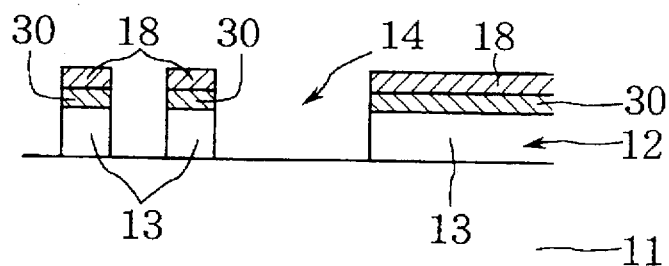
FIGS. 9A to 9D are views of the steps of the method for fabricating the semiconductor device according to a fourth embodiment of the present invention.

First, aluminium (Al) is sputtered on a silicon wafer 11 to form an about 1 μm-thickness aluminium layer 13. Then carbon is sputtered on the entire surface of the aluminium layer 13 to form an about 60 nm-thickness amorphous carbon layer 30. Subsequently a resist 18 is applied to the entire surface of the amorphous carbon layer 30, and the resist 18 is patterned in a required wiring pattern. Using this resist 18, the amorphous carbon layer 30 and the aluminium layer 13 are etched by using $Cl_2$ gas and $BCl_3$ gas. The aluminium wiring layer 13 with the amorphous carbon layer provided on has a 1 μm wire thickness, a 1 μm minimum wire width and a 1 μm minimum inter-wire interval (FIG. 9A).

Figure 9B:
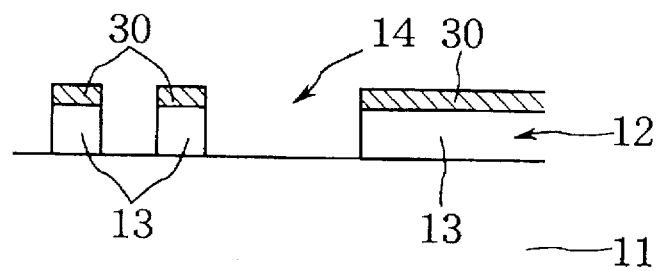

Then, only parts of the resist 18 on the amorphous carbon layer 30 are removed under the processing conditions which will be explained later by an ashing apparatus (not shown) using plasmas of $CF_4$ gas and $O_2$ gas (FIG. 9B).

Etching rates of the resist and the amorphous carbon by the ashing apparatus using $CF_4$ gas and $O_2$ gas were measured under various conditions.

1 KW microwaves were used, a flow rate of the ashing gas was $CF_4/O_2$=150/1000 (sccm ($N_2$ gas conversion)), a pressure was 1 Torr, and a processing temperature was changed from 70° C. to 232° C. The measured result are shown in the following TABLE 1.

TABLE 1

| Temperature (°C.) | 70 | 115 | 175 | 198 | 232 |
|---|---|---|---|---|---|
| Resist etching rate (nm/min) | 290 | 761 | 1442 | 1520 | 2996 |
| Amorphous carbon etching rate (nm/min) | 0 | 0 | 11 | 32 | 44 |

As apparent from TABLE 1, as the processing temperature goes up, the etching rate rises. At any processing temperature the resist and the amorphous carbon can have sufficient etching selection ratio. Especially at low processing temperatures amorphous carbon was not substantially etched.

In this embodiment, the resist 18 was selectively etched at about 115° C.

Figure 9C:
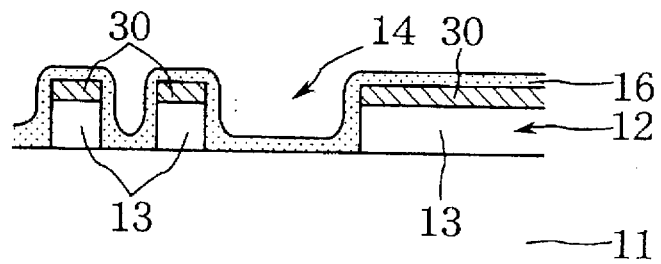

Inorganic SOG, which reflows at about 200° C. was applied in an about 0.1 Nm, by spin coat, to a silicon wafer having the amorphous carbon layer 30 and the aluminium wires 13, and then the solvent is dried by a hot plate at 150° C. Thus an SOG film 16 is formed on the upper surface of the silicon wafer 11 including the aluminium wires 13 and the amorphous carbon layer 30 (FIG. 9C).

Following the formation of the SOG film 16, a solution of 0.8 μm-diameter silica particles 15 dispersed in MIBK (methylisobutyl ketone) solvent is applied to the entire upper surface of the silicon wafer 11 by spin coat to lay the silica particles without any gap.

Figure 9D:
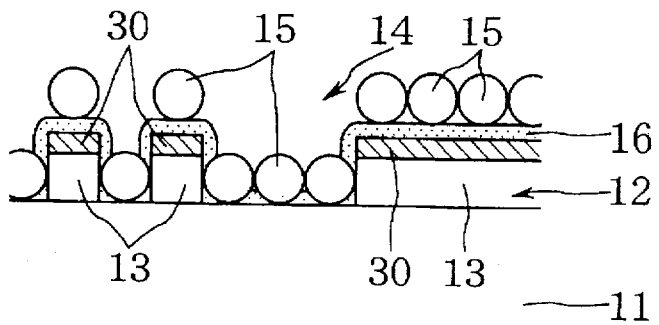

By this application of the silica particles dispersed liquid, the silica particles 15 are laid without any gap in concavities defined between aluminium wires 13 on the silicon wafer 11, and on the amorphous carbon layer 30 through the SOG film 16 (FIG. 9D).

Figure 10A:
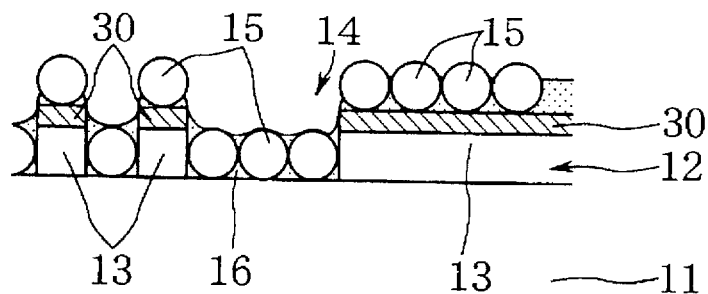
FIGS. 10A to 10C are views of the steps of the method for fabricating the semiconductor device according to the fourth embodiment of the present invention.

The silicon wafer 11 is heated at 250° C. to be baked, so that the silica particles 15 are adhered to the upper surface of the silicon wafer 11 through the reflowed SOG film (FIG. 10A).

Figure 10B:
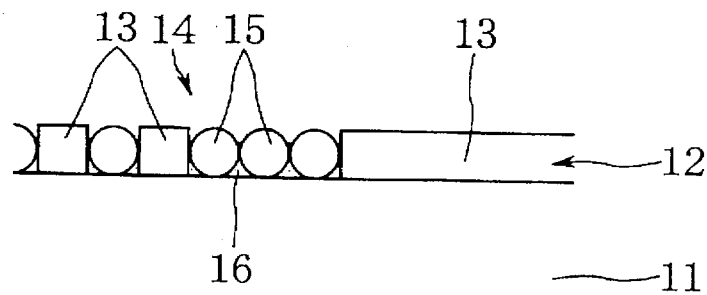

Subsequently the amorphous carbon layer 30 is removed from the silicon wafer 11 with the silica particles adhered to at a treating temperature above 200° C. by the above-described ashing apparatus. The removal of the amorphous carbon layer 30 removes (lifted off) the silica particles 15 on the amorphous carbon layer 30 from the silicon wafer 11 together with amorphous carbon layer 30 (FIG. 10B).

The silica particles 15 in the concavities 14 between aluminium wires 13 eliminate steps between the aluminium wires 13 and the recesses 14.

Then the silicon wafer 11 after the lift-off process is rinsed with pure wafer.

Figure 10C:
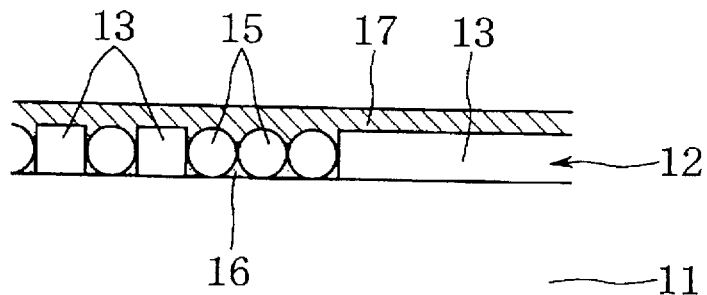

Then the silicon oxide film 17 is formed on the entire surface of the silicon wafer 11 (FIG. 10C).

Thus, according to this embodiment, the resist is removed immediately following the patterning of the aluminium layer without leaving the resist for a long period of time. Consequently corrosion of the aluminium wires 13 due to residues based on hydrogen chloride used in the etching can be prevented.

A method for fabricating a semiconductor device according to a fifth embodiment of the present invention will be explained with reference to FIGS. 11 and 12.

In the method for fabricating a semiconductor device according to this embodiment, an SOG film 16 is formed on the upper surface of a silicon wafer 11 not before silica particles 15 are laid, but after the silica particles 15 are laid.

Figure 11A:
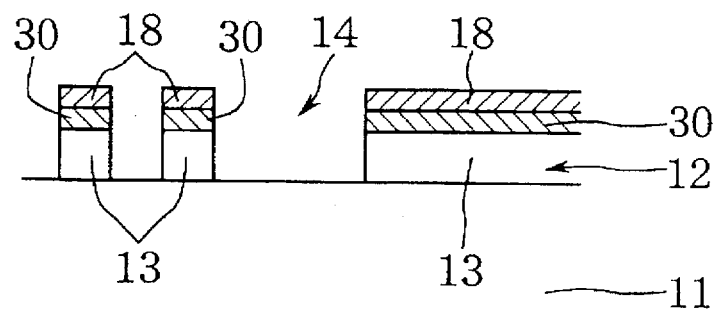
FIGS. 11A to 11C are views of the steps of the method for fabricating the semiconductor device according to a fifth embodiment of the present invention.

First, aluminium (Al) is sputtered on a silicon wafer 11 to form an about 1 μm-thickness aluminium layer 13. Then, carbon is sputtered on the entire surface of the aluminium layer 13 to form an about 60 nm-thickness amorphous carbon layer 30..Then a resist 18 is applied to the entire surface of the amorphous carbon layer 30, and the resist is patterned in a required wiring pattern. Using this resist pattern as the mask, the amorphous carbon layer 30, and the aluminium layer 13 are plasma or dry etched by using $Cl_2$ gas and $BCl_3$ gas. With the amorphous carbon layer 30 deposited, aluminium wires 13 having a 1 μm wire thickness, a 1 μm minimum width and a 1 μm minimum inter-wire interval (FIG. 11A).

Figure 11B:
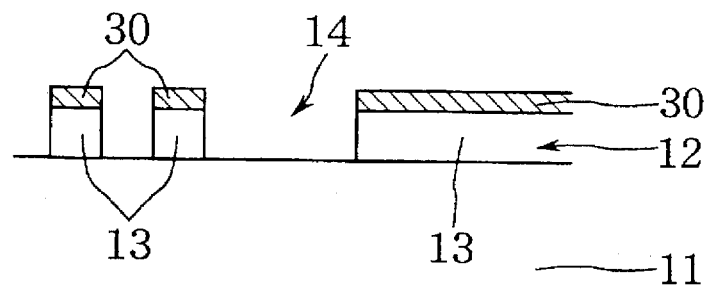

Subsequently the resist 18 is selectively etched at an about 115° C. treating temperature by the above-described ashing apparatus using $CF_4$ gas and $O_2$ gas (FIG. 11B).

Then a solution of 0.8 μm-diameter silica particles 15 dispersed in MIBK (methylisobutyl ketone) solvent is applied to the entire upper surface of the silicon wafer 11 by spin coat to lay the silica particles without any gap.

This application of the solution pay the silica particles concavities 14 between aluminium wires 13 on the silicon wafer, 11, and on the aluminium wires 13 without any gap between the silica particles (FIG. 11B).

Then a solution of 0.8 μm diameter silica particles 15 dispersed in MIBK (methylisobutyl ketone) solvent is applied to the upper surface of the silicon wafer 11 by spin coat to lay the silica particles 15 without any gap.

Figure 11C:
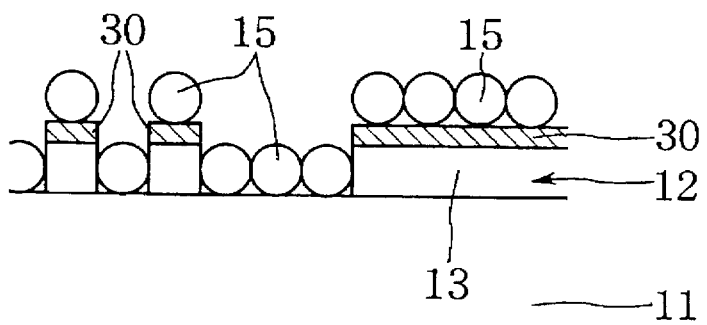

The application of this solution lays the silica particles 15 in the concavities 14, i.e. between the aluminium wires 13 on the silicon wafer 11, and on the aluminium wires 13 (FIG. 11C).

Then, the inorganic SOG which reflows at an about 200° C. is applied in an about 0.1 μm thickness by spin coat on the silicon wafer 11 with the silica particles laid on, and then the solvent is vaporized by a hot plate of 150° C.

Figure 12A:
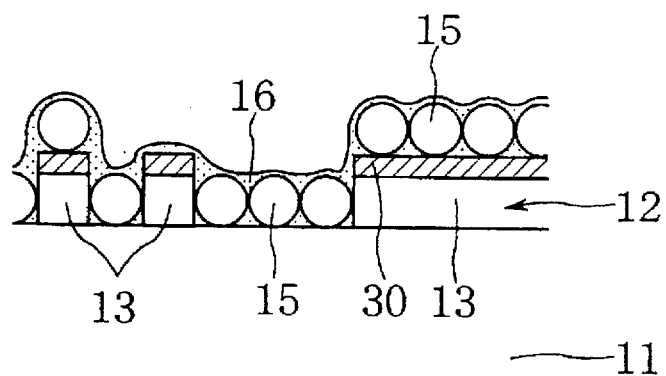
FIGS. 12A to 12C are views of the steps of the method for fabricating the semiconductor device according to the fifth embodiment of the present invention.

Thus the SOG film 16 having the silica particles 15 buried in the entire upper surface of the silicon wafer 11 is formed on the entire upper surface of the silicon water including the amorphous carbon layer 30 and the aluminium wires 13 (FIG. 12A).

Subsequently, the silicon wafer 11 is heated at 250° C. to bake the SOG film 16, and the silica particles 15 are adhered to the upper surface of the silicon wafer 11 through the reflowed SOG film 16.

Figure 12B:
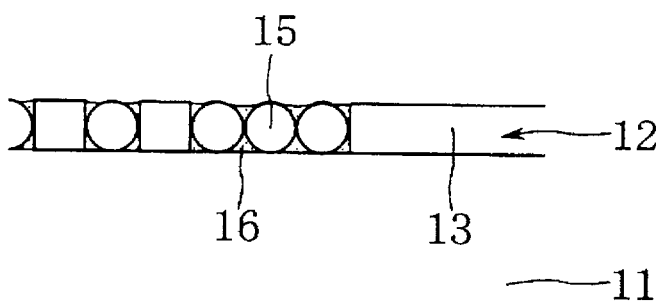

Then the amorphous carbon layer 30 is removed, at a processing temperature above 200° C. by the above-described ashing apparatus, from the silicon wafer 11 with the silica particles 15 adhered to. Thus the amorphous carbon layer 30 is removed (lifted off) to remove the amorphous carbon layer 30, and the silica particles on the amorphous carbon layer 30 from the silicon wafer 11 (FIG. 12B).

The silica particles 15 buried in the concavities between the aluminium wires 13 eliminate steps between the aluminium wires 13 and the silicon wafer 11.

Then the silicon wafer 11 after the lift-off is rinsed with pure water.

Figure 12C:
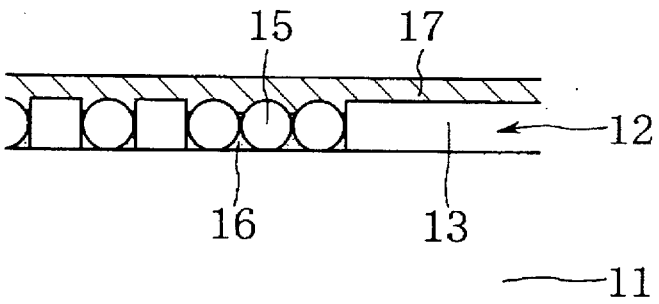

The silicon oxide film 17 is formed on the entire surface of the silicon wafer 11 by CVD (FIG. 12C).

Thus according to this embodiment, the resist is removed immediately following patterning of the aluminium layer without leaving the resist for a long period of time. Accordingly generation corrosion of the aluminium wires 13 due to residues based on hydrogen chloride used in the etching can be prevented.

A semiconductor device and a method for fabricating the semiconductor device according to a sixth embodiment of the present invention will be explained with reference to FIGS. 13 to 16.

Figure 13:
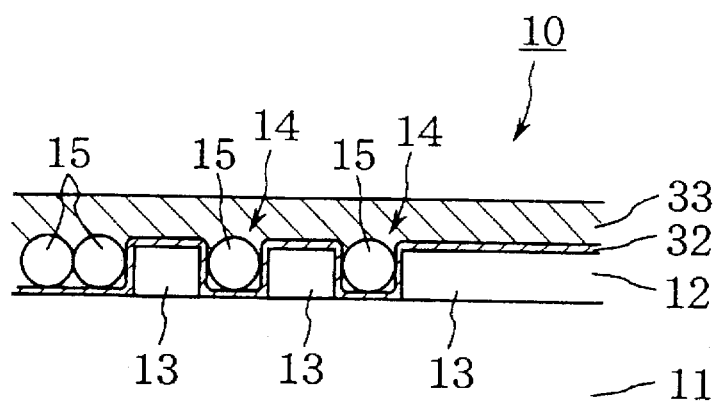
FIG. 13 is a sectional view of the semiconductor device according to a sixth embodiment of the present invention.

As shown in FIG. 13, the semiconductor device according to this embodiment has the so-called multi-layer wiring structure having a plurality of wiring layers 12 (one of them shown) on a silicon wafer 11. The wiring layer 12 includes aluminium wires (convexities) 13. Concavities 14 are formed between each aluminium wire 13 and its adjacent one 13. The concavities 14 have a depth of steps between the aluminium wires 13 and the silicon wafer 11.

A silicon oxide film 32 having a 50 nm thickness is formed on the aluminium wires 13 and the concavities 14 over the entire silicon wafer 11.

Silica particles 15 are disposed on the silicon oxide film 32 in the concavities 14. The silica particles 15 have surfaces coated with thin SOG coatings (not shown). The silica particles 15 are adhered to the silicon oxide film 32 through the thin SOG coatings.

The silica particles 15 can planarize the wiring layer 12 even when the wiring layer 12 as the next lower layer is rough.

A silicon oxide film 33 by CVD is formed on the silica particles 15 and the silicon oxide film 32 over the entire silicon wafer 11.

Thus, by forming an inter-layer insulating film of the silicon oxide film 32, the silica particles 15 and the silicon oxide film 33, the semiconductor device 10 of the multi-layer wiring structure can eliminate the so-called global steps to thereby sufficiently planarize not only the regions between the wires but also the entire surface of the wiring layer 12, which is to be a next lower layer.

Figure 14:
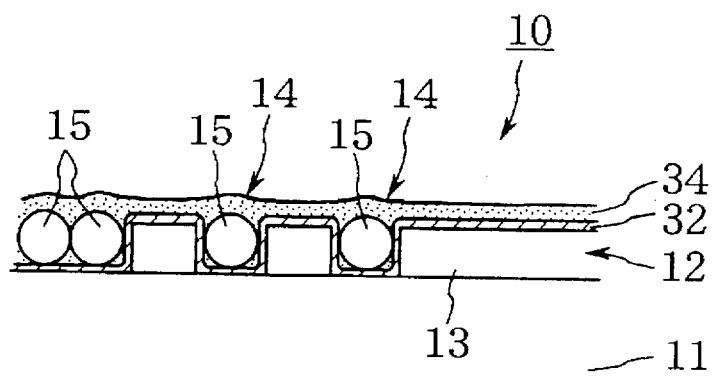
FIG. 14 is a sectional view of another example of the semiconductor device according to the sixth embodiment of the present invention.

FIG. 14 is a view of another example of the semiconductor device according to the sixth embodiment.

As shown in FIG. 14, a SOG film 34 in place of the silicon oxide film 33 is formed on the silica particles 15 and the silicon oxide film 32 over the entire silicon wafer 11.

Figure 15A:
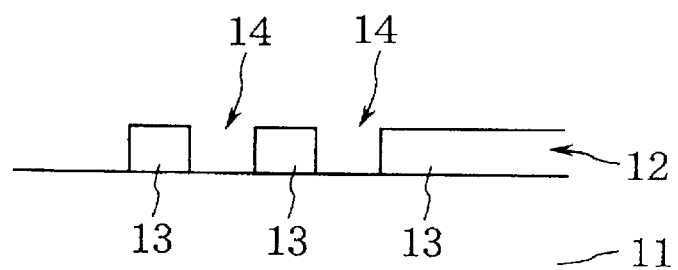
FIGS. 15A to 15C are views of the steps of the method for fabricating the semiconductor device according to the sixth embodiment of the present invention.

Next the method for fabricating the semiconductor device according to this embodiment of the present invention will be explained with reference to FIGS. 15 and 16.

First, a wiring layer 12 with aluminium wires 13 is formed on a silicon wafer 11.. The wiring layer 12 includes the aluminium wires 13 in a 1 μm minimum wire width at a 1 μm minimum inter-wire interval (FIG. 15A).

Figure 15B:
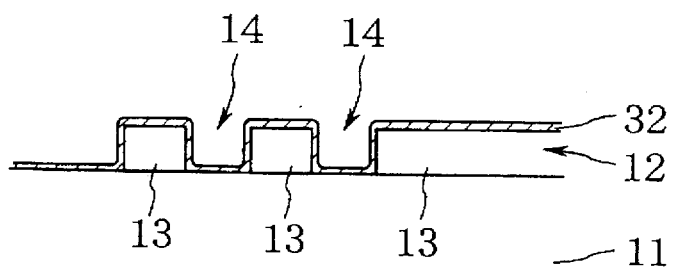
Figure 16A:
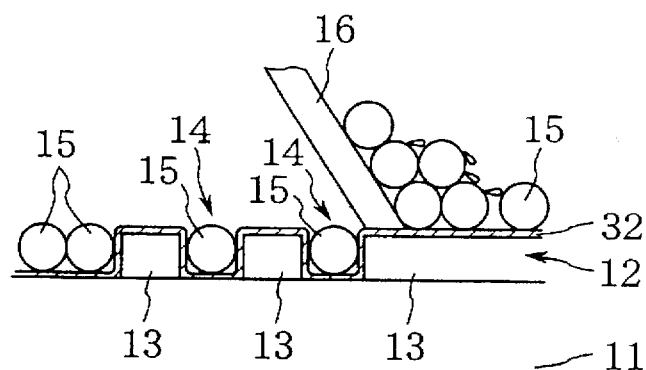
FIGS. 16A to 16C are views of the steps of the method for fabricating the semiconductor device according to the sixth embodiment of the present invention.

Then a silicon oxide film 32 is formed on the aluminium wires 13 and concavities 14 over the entire silicon wafer 11 by CVD (FIG. 15B).

Figure 15C:
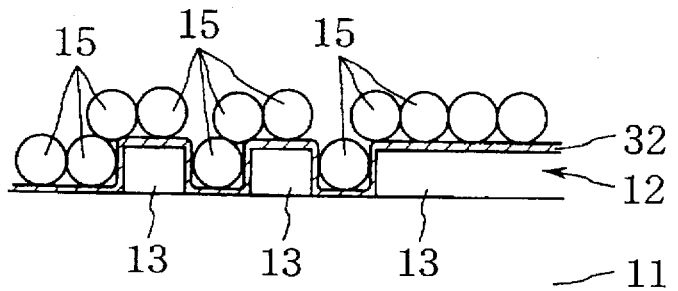

Subsequently a solution of 0.8 μm diameter silica particles 15 dispersed in MIBK (methylisobutyl ketone) solvent is applied to the upper surface of the silicon wafer 11 by spin coat to lay the silica particles 15 without any gap (FIG. 15C). The silica particles 15 have surfaces coated with thin SOG coatings (not shown).

Then the silicon wafer 11 is heated at 250° C. to bake the thin SOG coatings on the surfaces of the silica particles 15, so that the silica particles 15 are adhered to the silicon oxide film 32 (FIG. 15C).

Subsequently a squeegee 19 for abrading off the silica particles 15 completely removes the silica particles 15 on the silicon oxide film 32 over the aluminium wires 13 (FIG. 6A). Thus the silica particles 15 are disposed on the silicon oxide film 32 only in the concavities 14 to planarize the wiring layer 12.

As a variation of this embodiment, abrasion means 20 shown in FIG. 7 which is moved on rotation over the silicon oxide film 32 to remove the silica particles 15 on the silicon oxide film 32 over the aluminium wires 13 may be used in place of the squeegee 19.

Figure 16B:
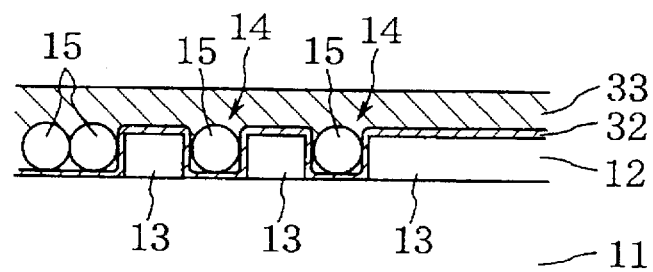

Subsequently, a silicon oxide film 33 is formed on the silica particles 15 and the silicon oxide film 32 over the entire silicon wafer 11 by CVD (FIG. 16B).

Figure 16C:
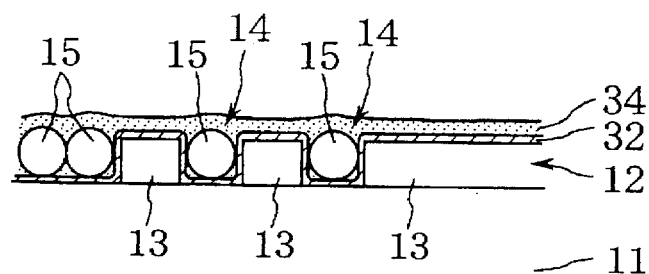

In place of forming the silicon oxide film 33 by CVD, inorganic SOG to be reflowed at about 200° C. is applied in an about 0.1 μm thickness by spin coating over the silicon wafer 11, and the solvent is dried by means of a 150° C. hot plate. And an SOG film 34 is formed on the silica particles 15 and the silicon oxide film 32 over the entire silicon wafer 11 (FIG. 16C).

Thus, by forming an inter-layer insulating film of the silicon oxide film 32, the silica particles 15 and the silicon oxide film 33 or the SOG film 34, the semiconductor device 10 of the multi-layer wiring structure can eliminate the so-called global steps to thereby sufficiently planarize not only the regions between the wires but also the entire surface of the wiring layer 12, which is to be a next lower layer.

What is claimed is:

1. A method for fabricating a semiconductor device comprising:

a granular insulators laying step of laying granular insulators over an upper surface of a semiconductor substrate to provide the granular insulators in concavities in the upper surface of the semiconductor substrate; and a granular insulators removing step of removing the granular insulators provided on convexities on the upper surface of the semiconductor substrate;

the granular insulators having a particle size between 0.3 to 1.5 times the height of the concavities.

2. A method for fabricating a semiconductor device according to claim 1, further comprising:

a spin on glass film applying step of applying a spin on glass film onto the upper surface of the semiconductor substrate before the granular insulators laying step; and a spin on glass film heat treating step of heat treating the spin on glass film after the granular insulator laying step to adhere the granular insulators to the semiconductor substrate through the spin on glass film.

3. A method for fabricating a semiconductor device according to claim 1, further comprising:

a spin on glass film applying step of applying the spin on glass film onto the granular insulators after the granular insulators laying step; and a spin on glass film heat treating step of heat treating the spin on glass film after the spin on glass film applying step to adhere the granular insulators to the semiconductor substrate through the spin on glass film.

4. A method for fabricating a semiconductor device according to claim 1, further comprising a lift-off layer forming step of forming a lift-off layer on the semiconductor layer before the granular insulators laying step, the granular insulators removing step being for removing the lift-off layer to remove the granular insulators on the lift-off layer.

5. A method for fabricating a semiconductor device according to claim 2, further comprising a lift-off layer forming step of forming a lift-off layer on the semiconductor layer before the granular insulators laying step, the granular insulators removing step being for removing the lift-off layer to remove the granular insulators on the lift-off layer.

6. A method for fabricating a semiconductor device according to claim 3, further comprising a lift-off layer forming step of forming a lift-off layer on the semiconductor layer before the granular insulators laying step, the granular insulators removing step being for removing the lift-off layer to remove the granular insulators on the lift-off layer.

7. A method for fabricating a semiconductor device according to claim 4, wherein the lift-off layer is formed of a resist.

8. A method for fabricating a semiconductor device according to claim 4, wherein the lift-off layer is formed of amorphous carbon.

9. A method for fabricating a semiconductor device according to claim 1, wherein the granular insulators removing step is scraping the upper surface of the semiconductor substrate or grinding the semiconductor substrate to remove the granular insulators on the convexities.

10. A method for fabricating a semiconductor device according to claim 2, wherein the granular insulators removing step is scraping the upper surface of the semiconductor substrate or grinding the semiconductor substrate to remove the granular insulators on the convexities.

11. A method for fabricating a semiconductor device according to claim 3, wherein the granular insulators removing step is scraping the upper surface of the semiconductor substrate or grinding the semiconductor substrate to remove the granular insulators on the convexities.

12. A method for fabricating a semiconductor device according to claim 1, further comprising:

a silicon oxide film forming step of forming a silicon oxide film onto the upper surface of the semiconductor substrate before the granular insulators laying step; and a heat treating step of heat treating the granular insulators after the granular insulators laying step to adhere the granular insulators to the semiconductor substrate through the silicon oxide film.

13. A method for fabricating a semiconductor device according to claim 12, wherein the granular insulators removing step is scraping the upper surface of the semiconductor substrate or grinding the semiconductor substrate to remove the granular insulators on the convexities.

* * * * *